(12) United States Patent
Igarashi et al.

(10) Patent No.: US 9,824,907 B2
(45) Date of Patent: Nov. 21, 2017

(54) GAS PURGE APPARATUS, LOAD PORT APPARATUS, AND GAS PURGE METHOD

(71) Applicant: TDK CORPORATION, Minato-ku, Tokyo (JP)

(72) Inventors: Hiroshi Igarashi, Tokyo (JP); Tomoshi Abe, Tokyo (JP); Nozomu Kato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 48 days.

(21) Appl. No.: 15/075,012

(22) Filed: Mar. 18, 2016

(65) Prior Publication Data

US 2016/0276189 A1    Sep. 22, 2016

(30) Foreign Application Priority Data

Mar. 20, 2015    (JP) .................................. 2015-058248

(51) Int. Cl.
  *H01L 21/673*    (2006.01)
  *H01L 21/677*    (2006.01)

(52) U.S. Cl.
  CPC .. *H01L 21/67775* (2013.01); *H01L 21/67393* (2013.01)

(58) Field of Classification Search
  CPC ......... H01L 21/67389; H01L 21/67393; H01L 21/67775
  See application file for complete search history.

(56) References Cited

U.S. PATENT DOCUMENTS

| 7,654,291 | B2 * | 2/2010 | Miyajima | H01L 21/67017 141/4 |
| 7,726,353 | B2 * | 6/2010 | Okabe | H01L 21/67017 141/51 |
| 7,789,609 | B2 * | 9/2010 | Okabe | H01L 21/67772 141/51 |
| 7,841,371 | B2 * | 11/2010 | Okabe | H01L 21/67017 141/51 |
| 8,082,955 | B2 * | 12/2011 | Okabe | H01L 21/67017 141/51 |
| 8,302,637 | B2 * | 11/2012 | Okabe | H01L 21/67772 141/63 |
| 8,375,998 | B2 * | 2/2013 | Okabe | H01L 21/67017 141/51 |
| 8,413,693 | B2 * | 4/2013 | Okabe | H01L 21/67017 141/51 |
| 8,978,718 | B2 * | 3/2015 | Emoto | H01L 21/67017 141/51 |
| 9,010,384 | B2 * | 4/2015 | Yoshimura | H01L 21/67772 141/63 |
| 9,349,627 | B2 * | 5/2016 | Okabe | H01L 21/67772 |
| 9,508,579 | B2 * | 11/2016 | Nakano | H01L 21/67775 |

(Continued)

FOREIGN PATENT DOCUMENTS

JP    2003-060007 A    2/2003

*Primary Examiner* — Nicolas A Arnett
(74) *Attorney, Agent, or Firm* — Arent Fox LLP

(57) ABSTRACT

A gas purge apparatus, a load port apparatus, and a gas purge method are capable of filling a container with a cleaning gas without leaning the container to be purged. The first and second purge nozzles are configured to be escalated so that the first purge nozzle 30-1 contacts with the first purge port 5-1 whose distance to the regulating distance 90 is near before the second purge nozzle 30-2 contacts with the second purge port 5-2.

11 Claims, 11 Drawing Sheets

(56) References Cited

U.S. PATENT DOCUMENTS

| | | | |
|---|---|---|---|
| 9,543,179 B2* | 1/2017 | Jhon | H01L 21/67772 |
| 9,607,873 B2* | 3/2017 | Liao | H01L 21/67775 |
| 2003/0049101 A1 | 3/2003 | Seita | |
| 2004/0237244 A1* | 12/2004 | Suzuki | H01L 21/67126 |
| | | | 15/301 |
| 2009/0169342 A1* | 7/2009 | Yoshimura | H01L 21/67775 |
| | | | 414/217 |
| 2011/0214778 A1* | 9/2011 | Natsume | H01L 21/67775 |
| | | | 141/4 |
| 2012/0309286 A1* | 12/2012 | Nakano | H01L 21/67775 |
| | | | 454/305 |
| 2013/0000757 A1* | 1/2013 | Yoshimura | H01L 21/67772 |
| | | | 137/561 R |
| 2014/0109516 A1* | 4/2014 | Tominaga | H01L 21/67393 |
| | | | 53/432 |
| 2016/0365266 A1* | 12/2016 | Murata | H01L 21/67393 |
| 2017/0178942 A1* | 6/2017 | Sakata | H01L 21/67778 |

* cited by examiner

GAS PURGE APPARATUS, LOAD PORT APPARATUS, AND GAS PURGE METHOD

CROSS-REFERENCE TO RELATED APPLICATION

This application claims the priority of Japanese Patent Application No. 2015-058248, filed Mar. 20, 2015. The disclosure of the priority application is incorporated in its entirety herein by reference.

BACKGROUND OF THE INVENTION

1. Field of the Invention

The present invention relates to a gas purge apparatus, a load port apparatus, and a gas purge method.

2. Description of the Related Art

For example, manufacturing process of semiconductors includes the following technique (bottom purge): a gas purge nozzle is arranged on an installation stand of a load port apparatus and is made contact with a gas purge port provided at a bottom part of a wafer transport container to introduce a purge gas therethrough and clean the inner atmosphere of the wafer transport container by the purge gas.

Upon performing the bottom purge, the purge nozzle is moved toward the purge port to contact with the gas purge port provided at the bottom part of the wafer transport container to be purged (e.g., Patent Document 1). In this time, a plurality of the purge ports provided at the bottom part of the container may be pushed up by the purge nozzle, and the container may lean.

When the container leans, handling performance of wafers is deteriorated. For example, the following problems arise: the wafers placed on a shelf inside of the container lean and may be damaged; the purge gas may be leaked due to insufficient contact between the purge port and the purge nozzle; and the outside gas may flow into the container.

Patent Document 1: Japanese Patent Laid-Open No. 2003-60007

SUMMARY OF THE INVENTION

The present invention has been achieved in consideration of the circumstances. It is an object of the invention to provide a gas purge apparatus, a load port apparatus, and a gas purge method capable of filling a container with a cleaning gas without leaning the container to be purged.

To achieve the above object, the gas purge apparatus according to the present invention is for introducing a cleaning gas into a container whose bottom part includes a first purge port and a second purge port, comprising:
a table on which the container is detachably installed;
a movement regulating mechanism configured to contact with the container at a predetermined regulating position and regulate a relative movement at least in an upward direction of the container to the table;
a first purge nozzle configured to airtightly connect to the first purge port at a first elevated position whose distance from the regulating position is a first distance;
a second purge nozzle configured to airtightly connect to the second purge port at a second elevated position whose distance from the regulating position is a second distance that is longer than the first distance and whose distance from the first elevated position is longer than the second distance;
a first nozzle driving mechanism configured to move the first purge nozzle between a first lowered position spaced from the first purge port and the first elevated position;
a second nozzle driving mechanism configured to move the second purge nozzle between a second lowered position spaced from the second purge port and the second elevated position; and
a control means configured to control the first and second nozzle driving mechanisms,
wherein the control means is configured to control the nozzle driving mechanisms so that the first gas purge nozzle contacts with the first purge port before the second purge nozzle contacts with the second purge port.

In the gas purge apparatus according to the present invention, when the purge nozzles are connected to the purge ports, the first purge nozzle whose distance to the regulating position is short is made contact with the purge port before the second purge nozzle whose distance to the regulating position is long is made contact therewith. A moment for leaning the container around the regulating position occurs at the time of contact between the first purge nozzle and the first purge port, but this moment is smaller than a moment at the time of contact between the second purge nozzle and the second purge port. This is because the first elevated position where the first purge nozzle and the first purge port are connected has a short distance to the regulating position. Further, the first purge nozzle has already been in contact with the first purge port at the time of contact between the second purge nozzle and the second purge port, and the first purge nozzle can support the container from below. In this gas purge apparatus, the container can be thus prevented from leaning at the time of connection between the purge port and the purge nozzle. Also, the container is prevented from leaning, which can prevent the leaning from deteriorating handling performance of storage objects (e.g., wafers) housed inside the container. Also, it is possible to have a sufficient contact between the purge port and the purge nozzle, avoid gas leak, and prevent the outside gas from flowing into the container.

For example, in the gas purge apparatus according to the present invention,
an outlet capable of transporting a storage object housed in the container may be formed on a first side surface that is one of a plurality of side surfaces of the container and
a distance from the regulating position to the first side surface may be shorter than a distance from the regulating position to a second side surface that is another one of a plurality of the side surfaces of the container and opposes the first side surface in a state where the movement regulating mechanism regulates a movement of the container.

The regulating position is arranged near the first side surface where the outlet is formed, which can improve position accuracy on the side of the outlet and thus allows a robot arm for transporting the storage objects to smoothly go in and out from the outlet.

For example, the first and second elevated positions and a storage object housed in the container whose movement is regulated by the movement regulating mechanism may be arranged to avoid overlapping with each other in an orthographic view from above.

The purge nozzle and the purge port are arranged to avoid overlapping with the storage object, which can smoothly diffuse the cleaning gas introduced from the purge port at the bottom part into the container and prevent scattering of particles caused by collision of an excessively intensive airflow onto the storage object.

For example, in the gas purge apparatus according to the present invention, at least one of the first and second purge nozzles may comprise:

a nozzle body configured to have a cylindrical shape whose upper end has an upper opening and be hardly deformable while moving from the first or second elevated position to the first or second lowered position;

a cylindrical elastic member configured to have a base end portion fixed to the nozzle body to surround the upper opening and be elastically deformable while moving from the first or second elevated position to the first or second lowered position; and a contact member configured to be provided at a tip of the cylindrical elastic member and contact with the first or second purge port at the first or second elevated position, and wherein the contact member may be harder than the cylindrical elastic member.

The purge nozzle can be connected to the purge port with an excellent airtightness due to elastic deformation of the cylindrical elastic member. Since the contact member contacting with the purge port is harder than the cylindrical elastic member, the contact part can be effectively prevented from being damaged at the time of lowering of the purge nozzle due to adhesion of the contact part to the purge port even when being in contact with the port for supply for a long time compared with a direct contact between the tip of the cylindrical elastic member and the purge port. In the purge nozzle, it is also possible to prevent abrasion of the contact part, generation of particles, and operation failure caused by dust.

For example, in the gas purge apparatus according to the present invention, one of the first and second purge nozzles may be for supply, and the other may be for discharge.

In this gas purge apparatus, the gas purge nozzle for supply and the gas purge port for supply are arranged away from the gas purge nozzle for discharge and the gas purge port for discharge, and thus the cleaning gas can be effectively introduced into the entire container.

A gas purge method according to the present invention for introducing a cleaning gas into a container whose bottom part includes a first purge port and a second purge port, comprising the steps of:

installing the container on a table;

regulating a relative movement at least in an upward direction of the container to the table by a movement regulating mechanism configured to contact with the container at a predetermined regulating position;

escalating a first purge nozzle from a first lowered position spaced from the first purge port to a first elevated position whose distance from the regulating position is a first distance, wherein the first purge nozzle is airtightly connected to the first purge port at the first elevated position; and escalating a second purge nozzle from a second lowered position spaced from the second purge port to a second elevated position whose distance from the regulating position is a second distance that is longer than the first distance and whose distance from the first elevated position is a second elevated position that is longer the second distance, wherein the second purge nozzle is airtightly connected to the second purge port at the second elevated position, and wherein the first and second purge nozzles are configured to be escalated so that the first purge nozzle contacts with the first purge port before the second purge nozzle contacts with the second purge port.

According to the gas purge method, the container to be purged can be filled with the cleaning gas without leaning thereof.

DESCRIPTION OF THE PREFERRED EMBODIMENTS

Hereinafter, the present invention will be explained based on an embodiment shown in the figures.

Figure 1:
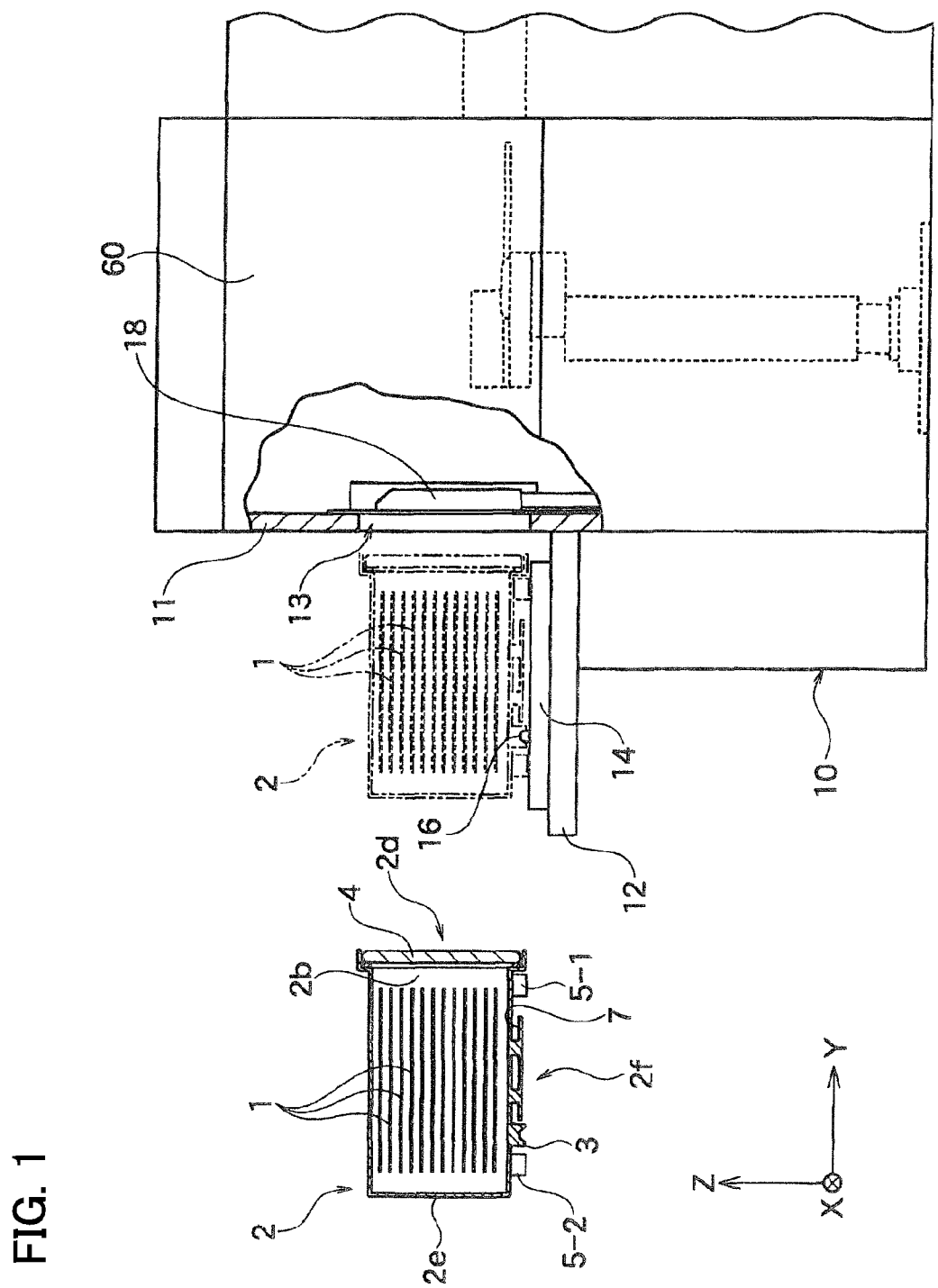
FIG. 1 is a schematic view of a load port apparatus to which a gas purge unit according to one embodiment of the present invention is applied.

As shown in FIG. 1, a load port apparatus 10 as a gas purge apparatus according to one embodiment of the present invention is connected to an EFEM 60 connecting a semiconductor processing apparatus and the load port apparatus 10. The load port apparatus 10 has an installation stand 12 and a movable table 14. The table 14 is movable in the Y-axis direction on the installation stand 12. Note that, in the figures, the Y-axis represents a moving direction of the table 14, the Z-axis represents a vertical direction, and the X-axis represents a direction vertical to the Y-axis and the Z-axis.

A sealed transport container 2 can be detachably placed on a top of the table 14 in the Z-axis direction. The container 2 is comprised of a pot or a FOUP etc. for transporting a plurality of wafers 1 as storage objects while they are sealed and stored. A space for housing the wafers 1 is formed in the container 2. The container 2 has a box shape with a plurality of side surfaces located horizontally and a top part and a bottom part 2f located vertically with respect to inside of the container 2. An outlet 2b capable for transporting the wafers 1 housed in the container 2 is formed on a first side surface 2d, which is one of a plurality of the side surfaces of the container 2. Note that, a bottom part 2f of the container 2 has the same plane shape as the table 14 shown in FIG. 2.

The sealed transport container 2 has a lid 4 for sealing the outlet 2b. Shelves (not shown) for vertically overlapping the wafers 1 held horizontally are arranged in the container 2. Each of the wafers 1 placed on the shelves is housed in the container 2 at regular intervals. The bottom part 2f of the container 2 includes a first purge port 5-1, a second purge port 5-2, a positioning portion 3, and an engagement end edge 7. The first and second purge ports 5-1 and 5-2 or so will be explained in detail below.

The load port apparatus 10 is an interface device for transporting the wafers 1 housed in a sealed state in the container 2 into a semiconductor processing apparatus through the EFEM 60 while maintaining a clean condition. The load port apparatus 10 has a door 18 opening and closing a delivery port 13 of a wall member 11. The wall member 11 is configured to function as part of a casing for sealing inside of the EFEM 60 in a clean condition, or as part of a casing for sealing inside of a semiconductor processing apparatus connected through the EFEM 60 in a clean condition.

The wafers 1 are transported from the container 2 while the container 2 is installed on the table 14. In the load port apparatus 10, a bottom gas purge for introducing a cleaning gas into the container 2 starts after a position regulating step by a clamp mechanism 50 with respect to the container 2 placed on the table 14 as mentioned below.

Further, the table 14 moves in the Y-axis direction, the lid 4 of the container 2 enters the delivery port 13 of the wall member 11, and the door 18 is engaged with the lid 4. Thereafter, the door 18 is moved with the lid 4 rotationally or in parallel with the Y-axis direction to remove the lid 4 from the container 2, and the outlet 2b is opened. In the load port apparatus 10, the inside of the container 2 and the inside of the EFEM 60 are connected in this way, and thus the wafers 1 in the container 2 can be transported using a robot arm or so provided in the EFEM 60.

Figure 2:
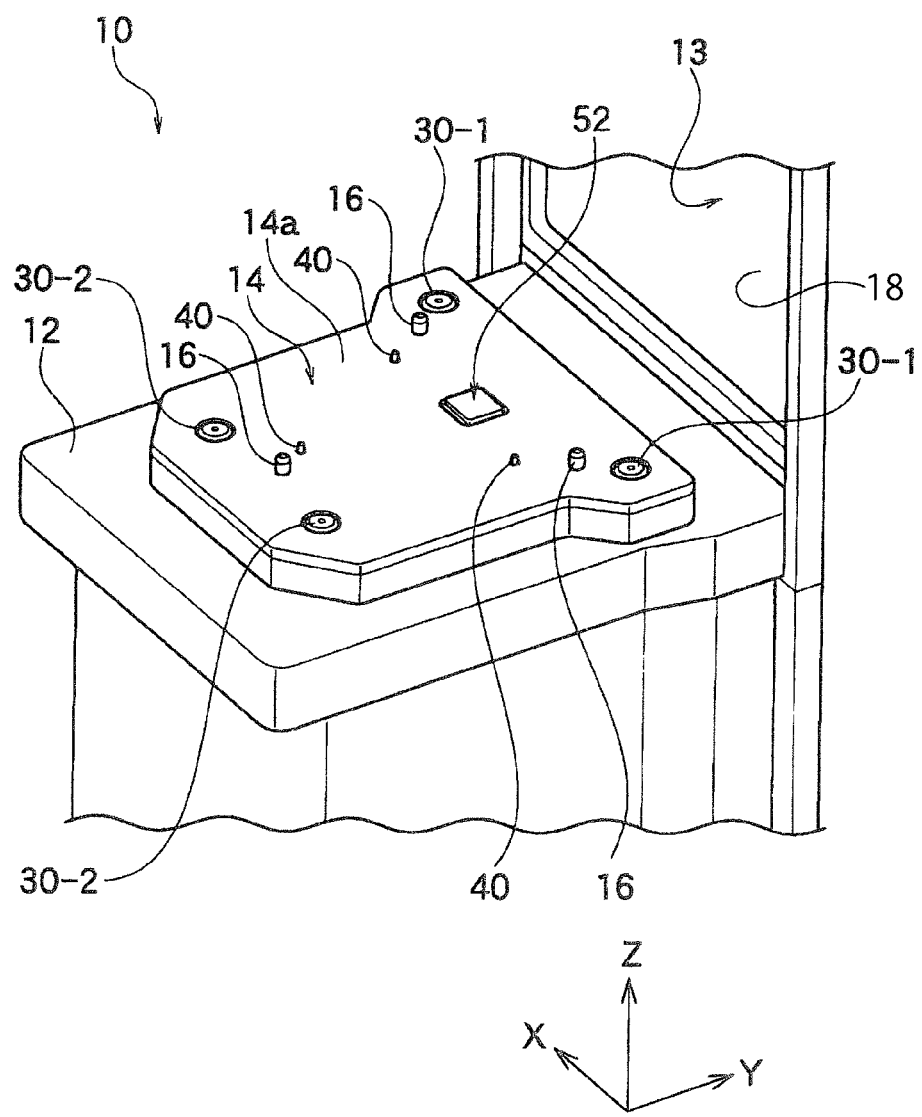
FIG. 2 is a perspective view of a main part showing a vicinity of a table of the load port apparatus shown in FIG. 1.

As shown in FIG. 2, one or more (preferably three) positioning pins 16 are embedded on a top surface 14a of the table 14. The positioning pins 16 are engaged with concave parts of the positioning portions 3 arranged on the bottom part 2f of the container 2. This uniquely determines a positional relation of the X-axis and the Y-axis between the container 2 and the table 14.

Also, position detecting sensors 40 are arranged near the respective positioning pins 16 on the top surface 14a of the table 14. The position detecting sensors 40 detect whether the container 2 is positioned at a predetermined position in the X-Y axis direction of the top surface 14a of the table 14. Any sensor can be used as the position detecting sensor 40, and a contact type position detecting sensor or a non-contact type position detecting sensor may be used.

The contact type position detecting sensor includes an electric detecting sensor whose switch is turned on by contacting with part of the bottom part 2f of the container 2. Also, the non-contact type position detecting sensor includes a light detecting sensor and a magnetic force detecting sensor. In either case, a detection signal detected by the position detecting sensors 40 is inputted to a control means 80 shown in FIG. 3A. The control means 80 consists of a control circuit, such as a microprocessor.

A head of a hook 52 is exposed in the central area along the X-axis of the top surface 14a of the table 14. In the state shown in FIG. 2, the head of the hook 52 is substantially flush with the top surface 14a of the table 14. In this embodiment, the hook 52 is arranged near the door 18 on the top surface 14a of the table 14 (front retaining mechanism).

Figure 3A:
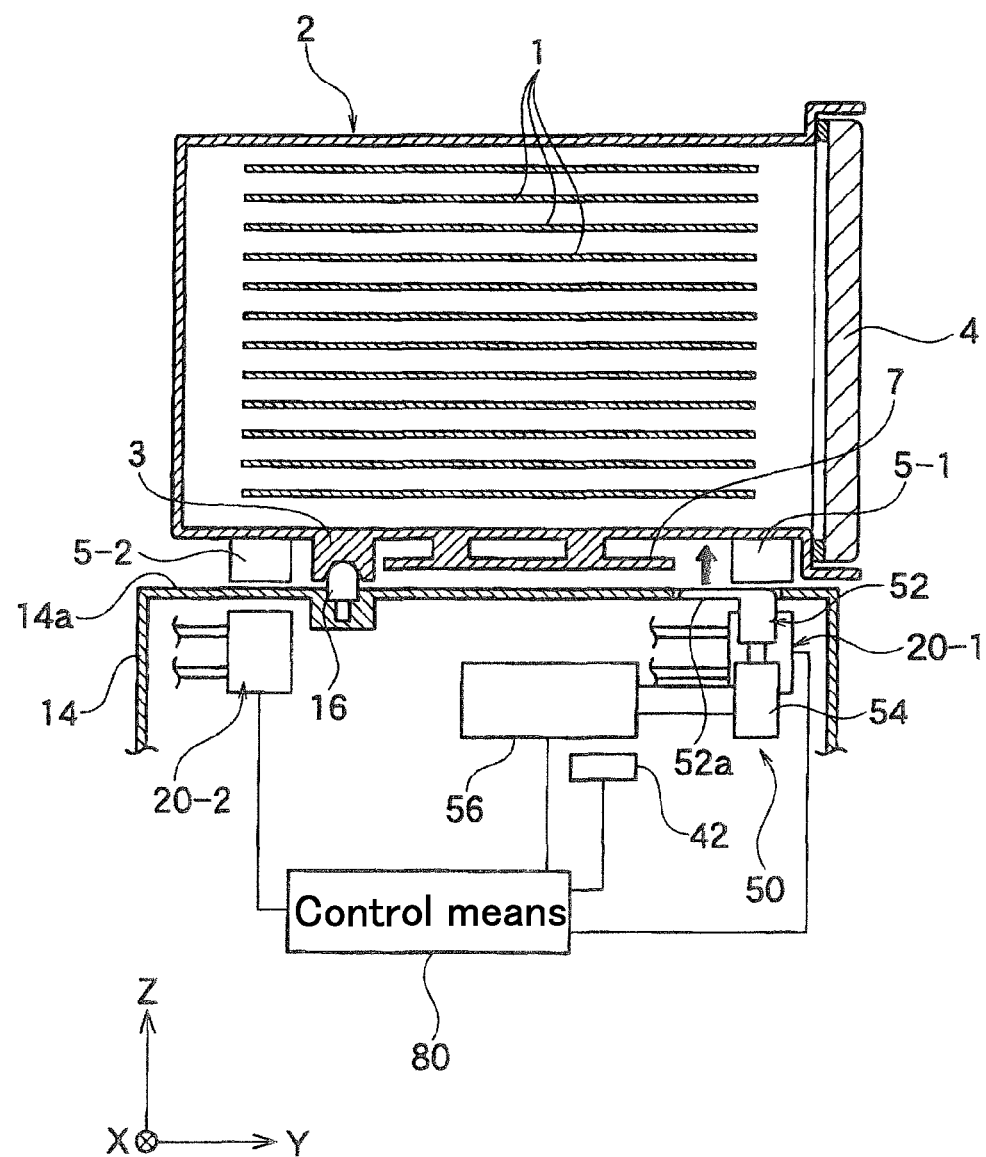
FIG. 3A is a schematic cross section of a gas purge apparatus incorporated in the load port apparatus shown in FIG. 1 and FIG. 2.

As shown in FIG. 3A, the hook 52 is part of the clamp mechanism 50 as a position regulating mechanism. The clamp mechanism 50 according to the present embodiment has a Z-axis driving mechanism 54 and a Y-axis driving mechanism 56. The Z-axis driving mechanism 54 moves the hook 52 up and down in the Z-axis direction. The Y-axis driving mechanism 56 moves the hook 52 forward and backward in the Y-axis direction. The clamp mechanism 50 is controlled by the control means 80.

Figure 3B:
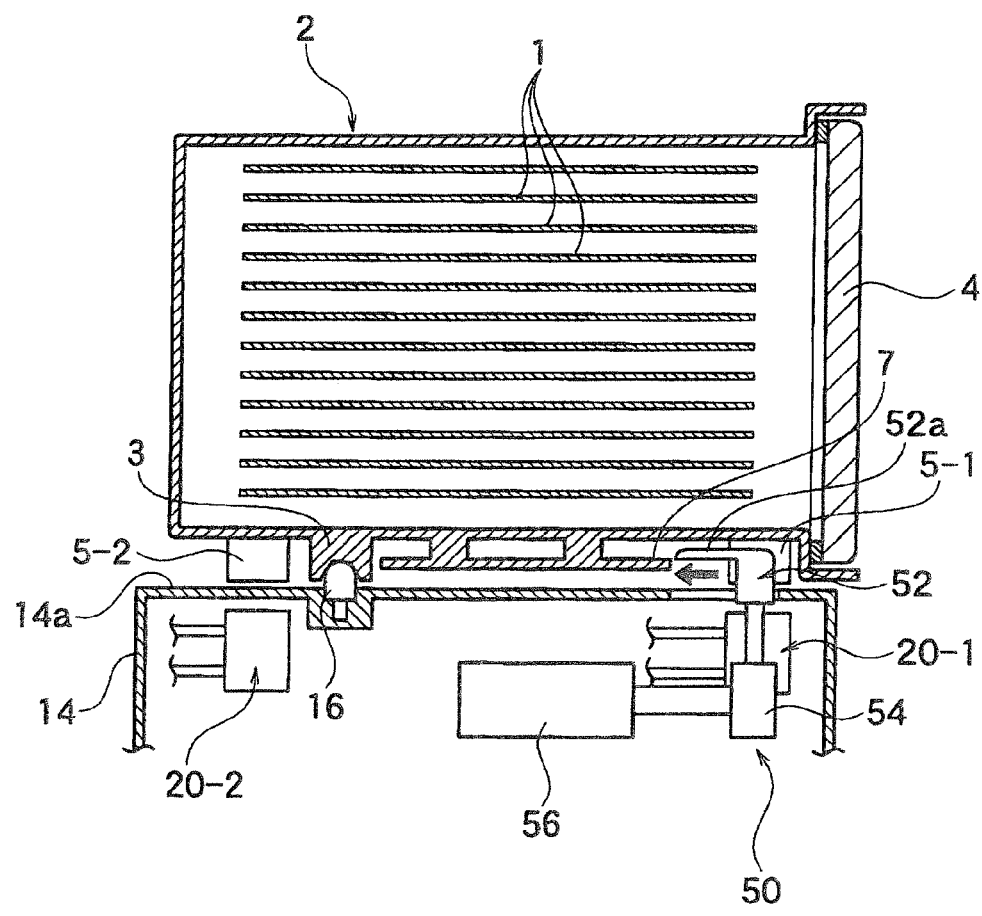
FIG. 3B is a schematic cross section showing a movement of a clamp mechanism of the gas purge apparatus shown in FIG. 3A.

For example, in the state shown in FIG. 3A, the hook 52 is drawn into the table 14 by the clamp mechanism 50 controlled by the control means 80, and the head of the hook 52 is flush with the top surface 14a of the table 14. When the control means 80 transmits a control signal, the Z-axis driving mechanism 54 is driven, and the hook 52 pops upward from the top surface 14a of the table 14, as shown in FIG. 3B.

Figure 3C:
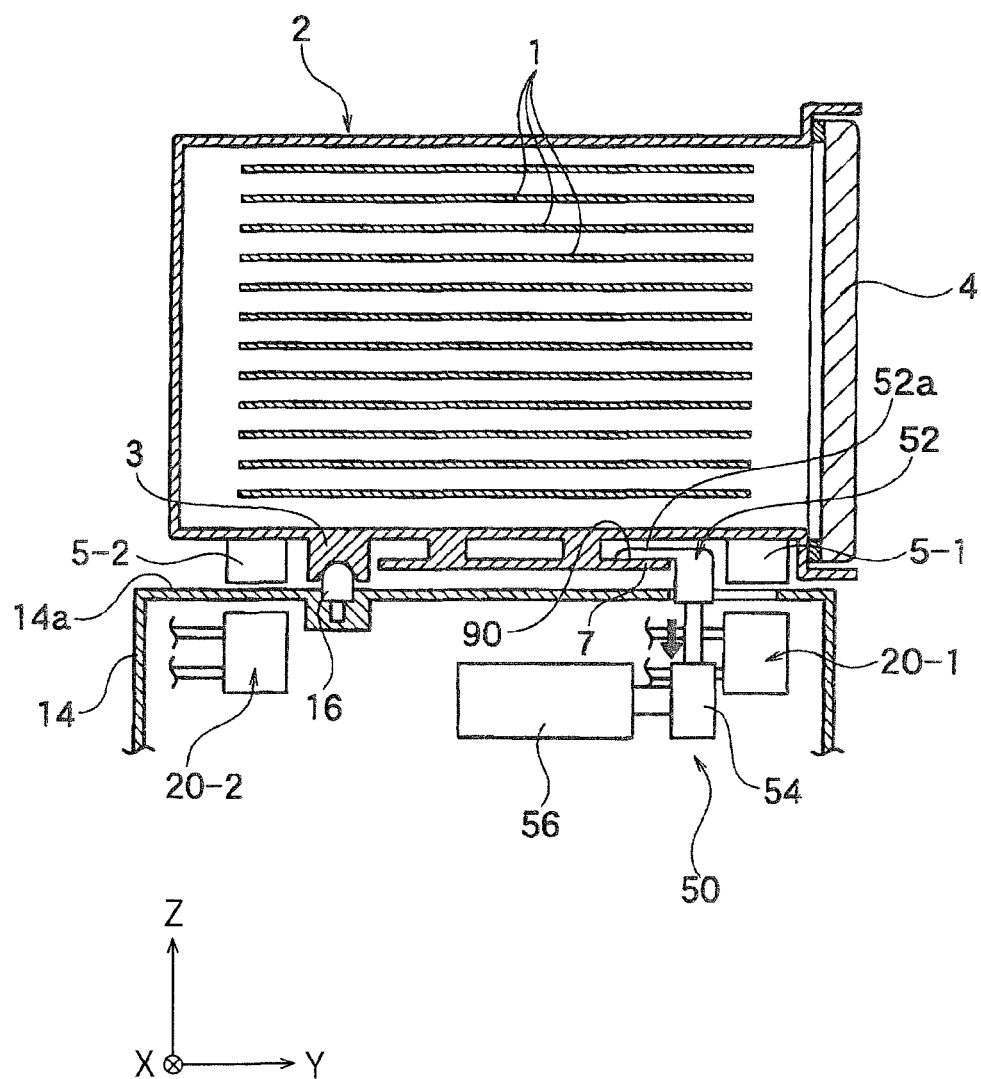
FIG. 3C is a schematic cross section showing a movement of the clamp mechanism following FIG. 3B.

For example, the engagement end edge 7 engaged with the hook 52 is formed on the bottom part 2f of the container 2. As shown in FIG. 3B and FIG. 3C, after the hook 52 is popped upward in the Z-axis direction from the top surface 14a of the table 14, the control means 80 drives the Y-axis driving mechanism 56, and an engagement convex part 52a of the hook 52 is arranged on a top of the engagement end edge 7.

Thereafter, the control means 80 drives the Z-axis driving mechanism 54, moves the hook 52 downward in the Z-axis direction, and presses the engagement convex part 52a of the hook 52 onto the top of the engagement end edge 7. In the clamp mechanism 50, a regulating position 90 is defined as a position where the engagement convex part 52a of the hook 52 contacts with the engagement end edge 7 of the container 2, and the container 2 is regulated to move relatively in the upward direction (Z-axis direction) with respect to the table 14. In the clamp mechanism 50 according to the present embodiment, the engagement convex part 52a is strongly engaged with the engagement end edge 7 at the regulating position 90, which can regulate the relative movement between the container 2 and the table 14 not only in the Z-axis direction but in the X-axis and Y-axis directions.

In the present embodiment, as shown in FIG. 3A, the clamp mechanism 50 is equipped with a clamp detection sensor 42. The clamp detection sensor 42 detects whether the relative movement of the container 2 with respect to the table 14 is normally regulated or restricted by the hook 52 as shown in FIG. 3C, and this detection signal is inputted to the control means 80. Any sensor can be used for the clamp detection sensor 42, and a contact type sensor or a non-contact type sensor may be used.

Note that, in the figures, the first and second purge ports 5-1 and 5-2, first and second purge nozzles 30-1 and 30-2, the positioning pin 16, the hook 52, and the like are relatively largely illustrated for easy understanding, but are different from actual dimension ratio.

Aside from the position detecting sensors 40 and the clamp detection sensor 42, the load port apparatus 10 may be equipped with a load presence sensor detecting whether the container 2 is on the table 14. For example, the load presence sensor is made of a non-contact type sensor, such as light sensor (light emitting element and light receiving element), or a contact type sensor, such as limit switch. When the load port apparatus 10 is equipped with the load presence sensor, a detection signal of the load presence sensor is also inputted to the control means 80 shown in FIG. 3A.

As shown in FIG. 2, heads of the first purge nozzles 30-1 and heads of the second purge nozzles 30-2 are exposed on the top surface 14a of the table 14. The load port apparatus 10 has the four purge nozzles 30-1 and 30-2 in total. Two of the four purge nozzles 30-1 and 30-2 located near the door 18 are the first purge nozzles 30-1, and the other two located opposite to the first purge nozzles 30-1 across the clamp mechanism 50 in the Y-axis direction are the second purge nozzles 30-2. Also, one of the first purge nozzles 30-1 is for discharge, and the other first purge nozzle 30-1 and the second purge nozzles 30-2 are for supply.

Figure 4A:
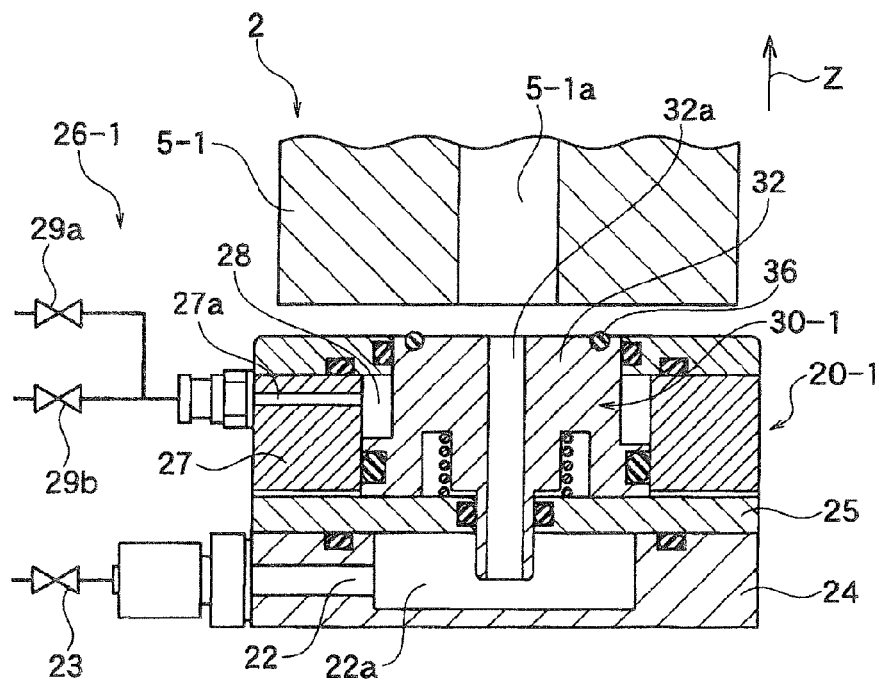
FIG. 4A is a schematic cross section showing a nozzle driving mechanism for moving the purge nozzle shown in FIG. 3A to FIG. 3C.
Figure 4B:
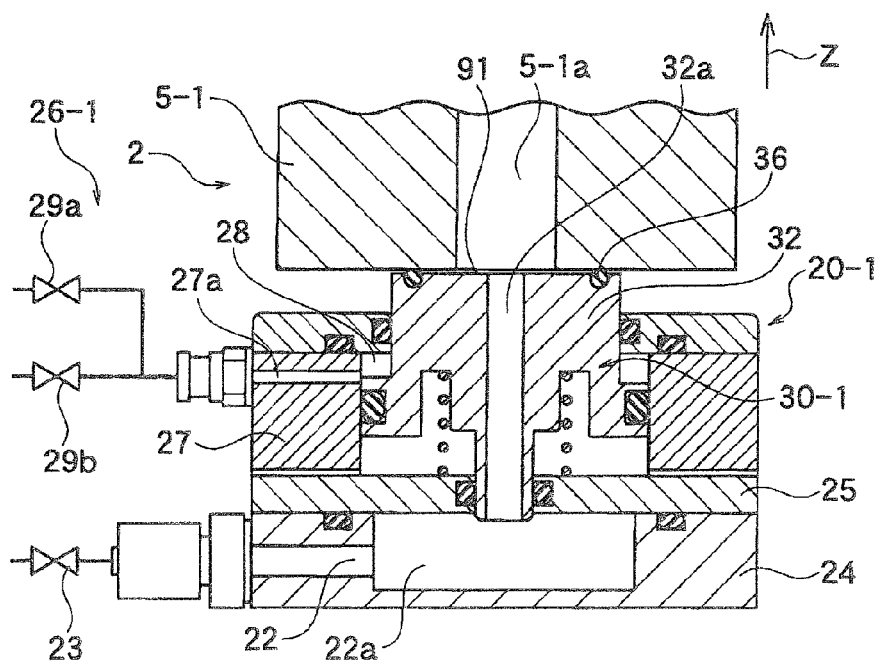
FIG. 4B is a schematic cross section showing a movement of a purge nozzle.

FIG. 4A and FIG. 4B are an enlarged cross section showing a detailed structure of a first gas purge unit 20-1 with the first purge nozzle 30-1 for supply. The gas purge unit with the first purge nozzle 30-1 for discharge has a cleaning gas flow opposite to the first gas purge unit 20-1 for supply, but has the same structure thereas. Also, a second gas purge unit 20-2 with the second purge nozzles 30-2 is arranged on the table 14 differently from the first gas purge unit 20-1 for supply, but has the same structure thereas. Thus, only the first gas purge unit 20-1 with the first purge nozzle 30-1 for supply will be explained, and the other gas purge unit will not be explained.

The first gas purge unit 20-1 has the first purge nozzle 30-1, a first nozzle driving mechanism 26-1, a control valve 23, a supply member 24, a partition plate 25, and the like. As shown in FIG. 4A, a supply passage 22 is formed in the supply member 24 and supplies a cleaning gas, such as nitrogen gas and other inert gas, to the first purge nozzle 30-1. A cylinder 27, which is part of the first nozzle driving mechanism 26-1, is fixed above in the Z-axis direction of the supply member 24 through the partition plate 25. The piston-type first purge nozzle 30-1 is housed in the cylinder 27 to be able to relatively move in the Z-axis direction.

The first nozzle driving mechanism 26-1 has the cylinder 27, an inflow valve 29a, an outflow valve 29b, and the like, and moves the first purge nozzle 30-1 up and down (Z-axis direction). A piston chamber 28 is formed between the first purge nozzle 30-1 and the cylinder 27. A pressure fluid, such as oil, is introduced to the piston chamber 28 or discharged therefrom through a piston passage 27a, and thus the first nozzle driving mechanism 26-1 can move the first purge nozzle 30-1 up and down in the Z-axis direction relatively to the cylinder 27. The introduction and discharge of the pressure fluid into and from the piston chamber 28 is controlled by opening and closing the inflow and outflow valves 29a and 29b connected to the piston passage 27a. The control means 80 shown in FIG. 3A controls the driving of the first purge nozzle 30-1 due to the first nozzle driving mechanism 26-1 by controlling the opening and closing of the inflow and outflow valves 29a and 29b.

The first nozzle driving mechanism 26-1 can move the first purge nozzle 30-1 between a first lowered position spaced from the first purge port 5-1 as shown in FIG. 4A and a first elevated position 91 airtightly in contact with the first purge port 5-1 as shown in FIG. 4B. When the first purge nozzle 30-1 is positioned at the first lowered position as shown in FIG. 4A, the head (top portion) of the first purge nozzle 30-1 in the Z-axis direction is flush with the top surface 14a of the table 14 or dented as shown in FIG. 2.

As shown in FIG. 4B, when the first purge nozzle 30-1 is positioned at the first elevated position 91, a head of a nozzle body 32 of the first purge nozzle 30-1 pops upward in the Z-axis direction from the top surface 14a of the table 14 shown in FIG. 2, and is closely in contact with the bottom surface of the first purge port 5-1 formed on the bottom part 2f of the container 2 shown in FIG. 4B. The head of the nozzle body 32 of the first purge nozzle 30-1 is equipped with a seal member 36, such as O-ring, and thus a nozzle opening 32a of the first purge nozzle 30-1 and a purge opening 5-1a of the first purge port 5-1 are connected airtightly.

A protrusion portion is formed at the lower end of the nozzle body 32 in the Z-axis direction, and a space 22a of the supply passage 22 and the nozzle opening 32a of the nozzle body 32 are connected even when the first purge nozzle 30-1 is positioned at the first elevated position 91. For example, the supply passage 22 is equipped with the control valve 23, and the cleaning gas can be flowed through the supply passage 22 by controlling the control valve 23.

In the state shown in FIG. 4B, the purge opening 5-1a of the first purge port 5-1 is connected to the nozzle opening 32a of the first purge nozzle 30-1, and further the nozzle opening 32a is connected to the space 22a of the supply passage 22. As a result, the cleaning gas is introduced into the container 2 shown in FIG. 5A through the purge opening 5-1a of the first purge port 5-1. Also, a bottom purge is performed by discharging the cleaning gas from the first purge nozzle 30-1 for discharge while introducing the cleaning gas from the first purge nozzle 30-1 for supply and the second purge nozzles 30-2. The gas purge unit 20-1 shown in FIG. 4A and FIG. 4B is controlled by the control means 80 shown in FIG. 3A.

Figure 5A:
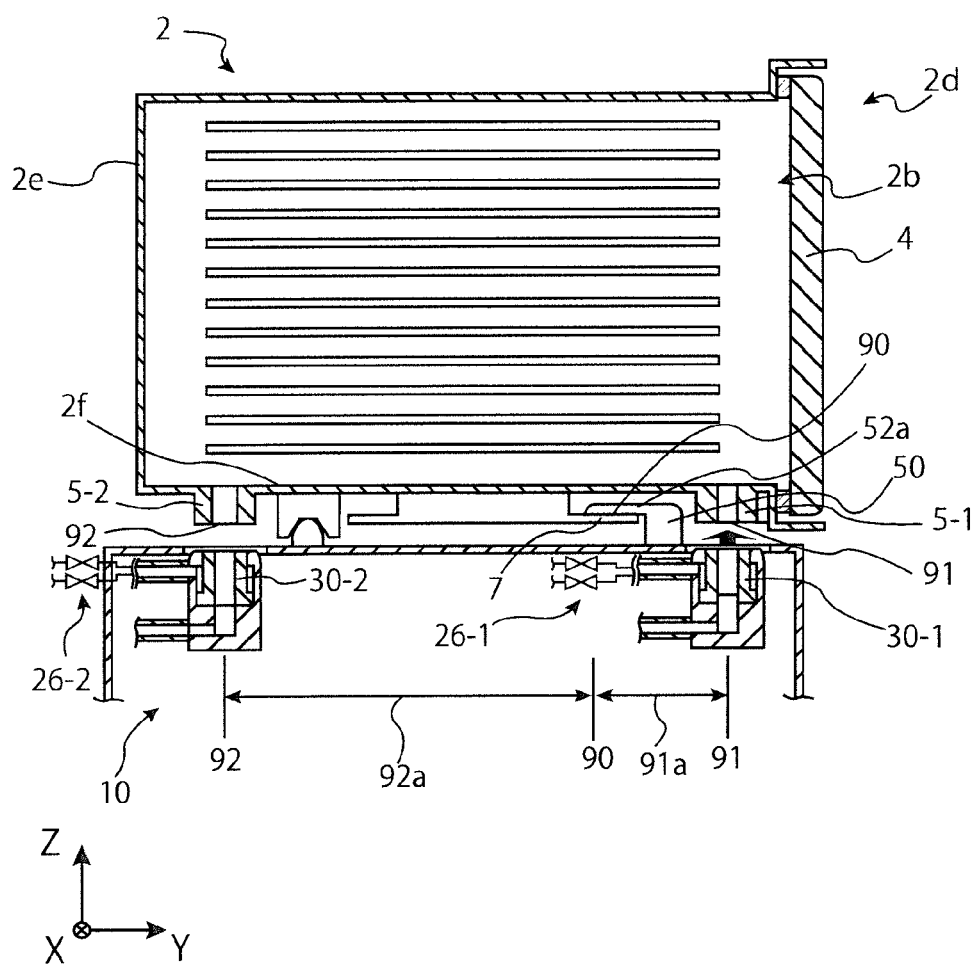
FIG. 5A is a schematic cross section showing a first operating state of purge nozzles.
Figure 5B:
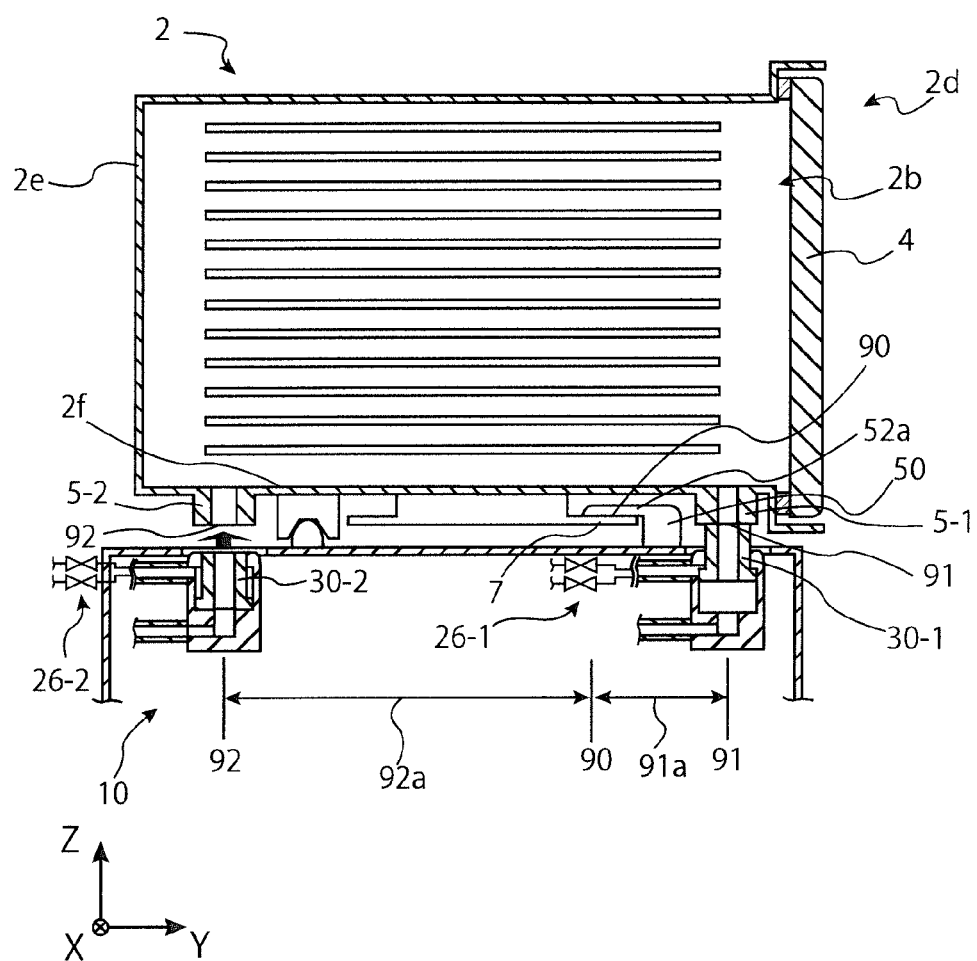
FIG. 5B is a schematic cross section showing a second operating state of purge nozzles.
Figure 5C:
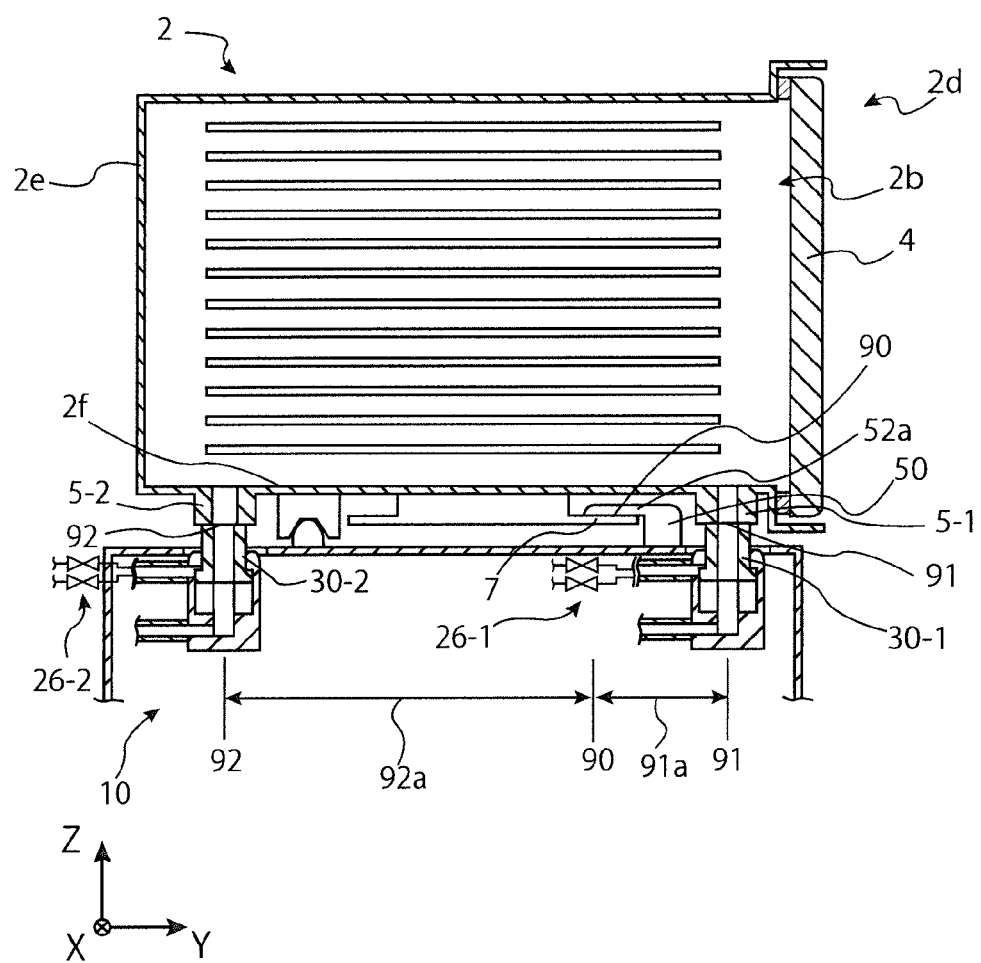
FIG. 5C is a schematic cross section showing a third operating state of purge nozzles.

As shown in FIG. 5C, the first purge nozzle 30-1 is airtightly connected to the first purge port 5-1 at the first elevated position 91 whose distance from the regulating position 90 of the container 2 by the clamp mechanism 50 is a first distance 91a. Also, the second purge nozzle 30-2 is airtightly connected to the second purge port 5-2 at a second elevated position 92 whose distance from the regulating position 90 is a second distance 92a that is longer than the first distance 91a and whose distance from the first elevated position 91 is longer than the second distance 92a.

Hereinafter, a procedure for starting the bottom gas purge by the load port apparatus 10 will be explained with reference to FIG. 3A, FIG. 3B, FIG. 3C, FIG. 5A, FIG. 5B, and FIG. 5C. When the load port apparatus 10 starts the bottom gas purge, the container 2 for gas purge is installed on the table 14. Note that, the container 2 is sealed and a vicinity of the wafers 1 housed therein is kept clean until the table 14 is placed in the load port apparatus 10.

When the container 2 is transported onto the top surface 14a of the table 14, the regulating means 80 shown in FIG. 3A firstly detects whether the container 2 is on the table 14 based on the detection signal from the load presence sensor. Without the detection, the following control step will not be carried out.

When the control means 80 detects the fact that the container 2 is on the table 14 based on the detection signal from the load presence sensor, the control means 80 then determines whether the container 2 is placed at a predetermined position on the table 14 by the position detecting sensors 40 shown in FIG. 2. When the container 2 is determined to be placed at the predetermined position on the table 14 based on the detection signal from the position detecting sensors 40, the control means 80 controls the clamp mechanism 50 to regulate a relative movement of the container 2 to the table 14.

The clamp mechanism 50 moves the hook 52 as shown in FIG. 3A to FIG. 3C, which allows the engagement convex part 52a of the hook 52 to contact with the engagement end edge 7 of the container 2 from above at the predetermined regulating position 90 (FIG. 3C). This regulates the relative movement of the container 2 in the upward direction (Z-axis direction) with respect to the table 14.

Next, the control means 80 shown in FIG. 3A receives the detection signal from the clamp detection sensor 42 and determines whether the container 2 is securely regulated to move relatively to the table 14. When this relative movement is determined to be regulated securely, the control means 80 then drives and controls the first and second nozzle driving mechanisms 26-1 and 26-2 of the first and second gas purge units 20-1 and 20-2 to move the first and second purge nozzles 30-1 and 30-2.

In the load port apparatus 10, the control means 80 drives the first nozzle driving mechanism 26-1 to elevate the first purge nozzle 30-1 at the first lowered position as shown in FIG. 5A to the first elevated position 91 as shown in FIG. 5B. The first purge nozzle 30-1 is airtightly connected to the first purge port 5-1 of the container 2 at the first elevated position 91 whose distance from the regulating position 90 is the first distance 91a. Note that, the two first purge nozzles 30-1 (FIG. 2) of the load port apparatus 10 are controlled to reach the first elevated position 91 at the same timing. As shown in FIG. 5B, the first purge nozzle 30-1 thus contacts with the first purge port 5-1 before the second purge nozzle 30-2 contacts with the second purge port 5-2.

Next, the control means 80 drives the second nozzle driving mechanism 26-2 to elevate the second purge nozzle 30-2 at the second lowered position as shown in FIG. 5B to the second elevated position 92 as shown in FIG. 5C. The second purge nozzle 30-2 is airtightly connected to the second purge port 5-2 of the container 2 at the second elevated position 92 whose distance from the regulating position 90 is the second distance 92a that is longer than the first distance 91a and whose distance from the first elevated position 91 is longer than the second distance 92a. Note that, the two second purge nozzles 30-2 (FIG. 2) of the load port apparatus 10 are controlled to reach the second elevated position 92 at the same timing.

In the load port apparatus 10, when the purge nozzles 30-1 and 30-2 are connected to the purge ports 5-1 and 5-2, the first purge nozzle 30-1 whose distance to the regulating position 90 is short is made contact with the first purge port 5-1 before the second purge nozzle 30-2 whose distance to the regulating position 90 is long is made contact therewith. A moment causing the container 2 to lean around the regulating position 90 may occur at the time of contact between the first purge nozzle 30-1 and the first purge port 5-1. The first elevated position 91 where the first purge nozzle 30-1 is connected to the first purge port 5-1, however, has a short distance to the regulating position 90 by the clamp mechanism 50, and the moment is thus considered to be smaller than a moment caused at the time of contact between the second purge nozzle 30-2 and the second purge port 5-2. In the load port apparatus 10, the first purge nozzle 30-1 whose distance to the regulating position 90 is short is securely made contact with the first purge port 5-1 before the second purge nozzle 30-2 is made contact therewith, which prevents the container 2 from leaning.

In the load port apparatus 10, the first purge nozzle 30-1 has already been in contact with the first purge port 5-1 at the time of contact between the second purge nozzle 30-2 and the second purge port 5-2, and the first purge nozzle 30-1 can receive the moment caused at the time of contact of the second purge nozzle 30-2 from below of the container 2. In the load port apparatus 10, the container 2 can be thus prevented from leaning at the time of connection between the purge ports 5-1 and 5-2 and the purge nozzles 30-1 and 30-2. Also, the container 2 is prevented from leaning, which can prevent deterioration of handling performance of the wafers 1 housed in the container 2 due to the leaning of the container 2. Also, it is possible to prevent a connection failure between the purge ports 5-1 and 5-2 and the purge nozzles 30-1 and 30-2 and leak of the cleaning gas accompanying therewith.

In the load port apparatus 10, as shown in FIG. 5A, the regulating position 90 by the clamp mechanism 50 is arranged on the side of the outlet 2b of the container 2 placed on the table 14 with respect to the middle of the table 14. That is, a distance from the regulating position 90 to the first side surface 2d where the outlet 2b is formed is shorter than a distance from the regulating position 90 to a second side surface 2e, which is another one of a plurality of the side surfaces of the container 2 and opposes the first side surface 2d. In this load port apparatus 10, the regulating position 90 is arranged near the first side surface 2d where the outlet 2b is formed, which can improve position accuracy on the side of the outlet 2b and thus allows a robot arm for transporting the wafers 1 to smoothly go in and out from the outlet 2b.

Figure 6:
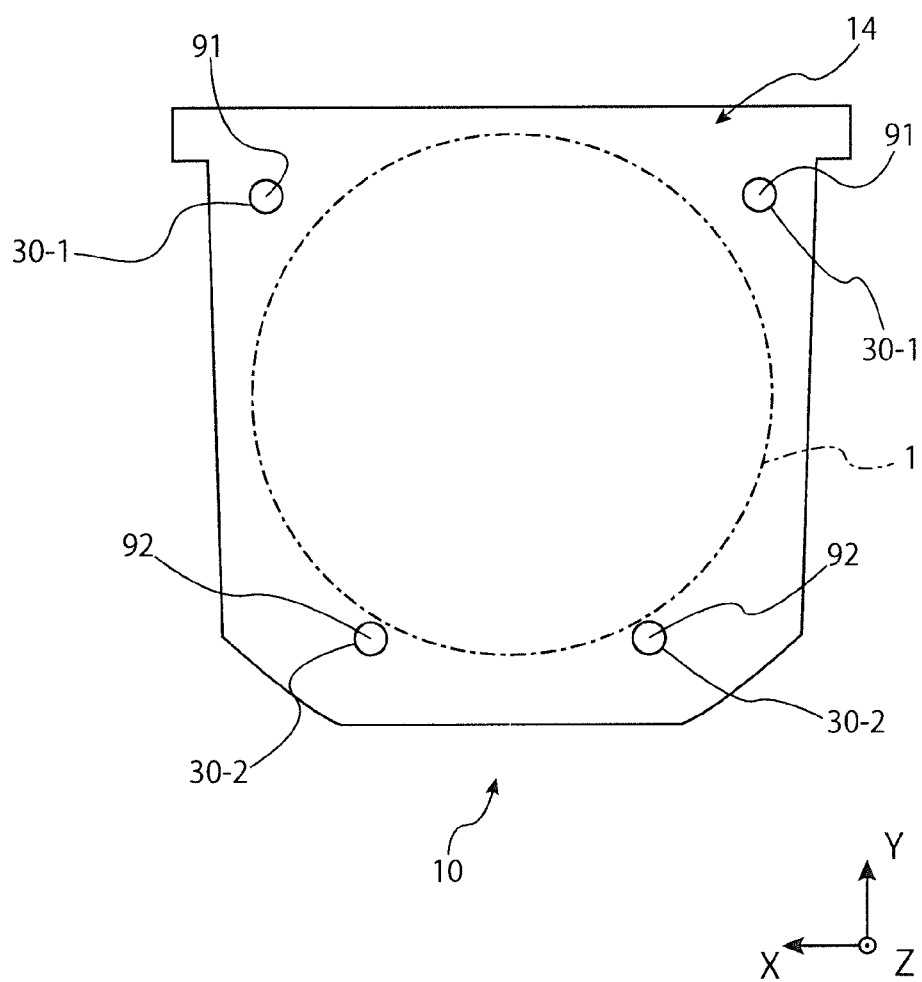
FIG. 6 is an orthographic view from above showing an arrangement relation between a wafer and purge nozzles.

In the load port apparatus 10, as shown in FIG. 6, the first and second elevated positions 91 and 92 connecting the purge nozzles 30-1 and 30-2 and the purge ports 5-1 and 5-2 are arranged to avoid overlapping with the wafers 1 in the container 2 clamped by the clamp mechanism 50 in an orthographic view from above. In this arrangement, it is possible to smoothly diffuse the cleaning gas introduced from the purge ports 5-1 and 5-2 of the container 2 thereinto and prevent scattering of particles caused by collision of an excessively intensive airflow onto the wafers 1. Also, in this arrangement, the distance from the regulating position 90 to the first elevated position 91 and the distance from the regulating position 90 to the second elevated position 92 are long, and the moment caused at the time of contact between the purge ports 5-1 and 5-2 and the purge nozzles 30-1 and 30-2 tends to be large. In the load port apparatus 10 according to the present embodiment, however, the first purge nozzle 30-1 whose distance to the regulating position 90 is short is made contact with the first purge port 5-1 in advance, and thus the container 2 can be prevented from leaning.

As shown in FIG. 5A, when the regulating position 90 is arranged on the side of the first side surface 2d near the outlet 2b, and when the first and second elevated positions 91 and 92 connecting the purge nozzles 30-1 and 30-2 and the purge ports 5-1 and 5-2 are arranged near corners of the container 2, the purge nozzle 30-1 on the side near the door 18 of the load port apparatus 10 is the first purge nozzle 30-1 contacting with the purge port 5-1 in advance, but the clamp mechanism 50 and the purge ports 5-1 and 5-2 are not limited to the arrangement of the embodiment.

Note that, the present invention is not limited to the above-mentioned embodiment, and can be variously changed within the scope thereof. For example, the second purge nozzle 30-2 starts moving after the first purge nozzle 30-1 is elevated to the first elevated position 91 in the embodiment explained in FIG. 5A and FIG. 5B, but the first purge nozzle 30-1 and the second purge nozzle 30-2 are not limited to move in this way. In the load port apparatus, the first purge nozzle 30-1 may be made contact with the first purge port 5-1 before the second purge nozzle 30-2 contacts therewith by starting elevating the second purge nozzle 30-2 while elevating the first purge nozzle 30-1 or by elevating the second purge nozzle 30-2 more slowly than the first purge nozzle 30-1, for example. Also, the first purge nozzle 30-1 may contact with the first purge port 5-1 before the second purge nozzle 30-2 contacts therewith by having a different height between the first and second lowered positions and having a different moving stroke in the Z-axis direction between the first purge nozzle 30-1 and the second purge nozzle 30-2.

The gas purge apparatus of the present invention is applied to the load port apparatus 10 in the above-mentioned embodiment, but may be applied to other apparatus. For example, the gas purge apparatus of the present invention may be applied to a shelf, an installation stand or so for placing and storing a plurality of the containers 2. Alternatively, the gas purge apparatus of the present invention may be arranged in other apparatus or location.

The first purge nozzle 30-1 and the first nozzle driving mechanism 26-1 explained in FIG. 4A and FIG. 4B are also just an embodiment of the present invention. The first nozzle driving mechanism 26-1 in the embodiment utilizes a fluid pressure control of the piston chamber 28, but the first nozzle driving mechanism 26-1 may drive the purge nozzles 30-1 and 30-2 by rotary motor or linear motor, for example.

Figure 7A:
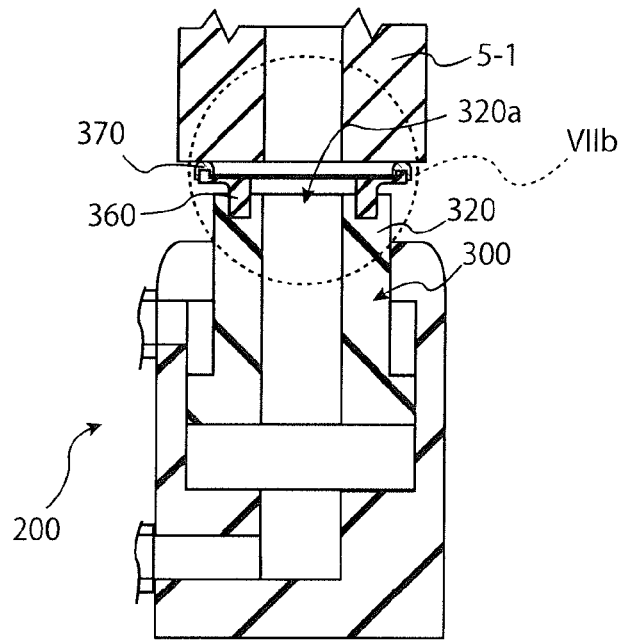
FIG. 7A is a schematic cross section showing a structure of a purge nozzle according to a variation.
Figure 7B:
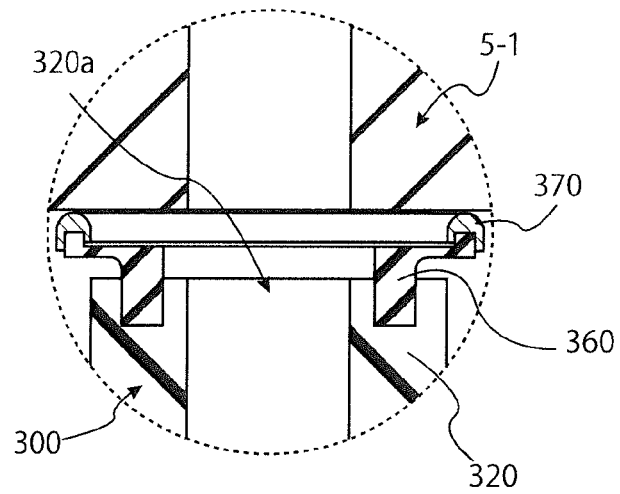
FIG. 7B is a partially enlarged view of FIG. 7A.

FIG. 7A is a schematic cross section of a purge nozzle 300 according to a variation of the present invention, and FIG. 7B is a partially enlarged view of FIG. 7A. The purge nozzle 300 can be applied to the load port apparatus 10 instead of the first and second purge nozzles 30-1 and 30-2 shown in the embodiment.

The gas purge nozzle 300 has a nozzle body 320 with a nozzle opening 320a for discharging a cleaning gas (or gas inflows from the container 2), a cylindrical elastic member 360 fixed to an upper end of the nozzle body 320, and a contact member 370 attached to a tip of the cylindrical elastic member 360. The nozzle body 320 has a cylindrical outer shape where the nozzle opening 320a as an upper opening is formed at the upper end. Also, the nozzle body 320 is manufactured using a hardly deformable material (metal, hard resin, or the like) due to external force compared with the cylindrical elastic member 360, and thus no deformation occurs while the purge nozzle 300 moves from the first or second elevated position where the purge nozzle 300 contacts with the first purge port 5-1 (or the second purge port 5-2) to the first or second lowered position.

The cylindrical elastic member 360 is fixed to the nozzle body 320 so that its base end portion surrounds the nozzle opening 320a. The cylindrical elastic member 360 is manufactured using an easily deformable material (rubber, soft resin, such as elastomer, or the like) due to external force compared with the nozzle body 320, and is elastically deformable while the purge nozzle 300 is moving from the first or second elevated position where the purge nozzle 300 contacts with the first purge port 5-1 (or the second purge port 5-2) to the first or second lowered position.

The contact member 370 is provided at the tip of the cylindrical elastic member 360 and directly contacts with the first purge port 5-1 (or the second purge port 5-2) at the first or second elevated position. The contact member 370 is harder than the cylindrical elastic member 360 and is manufactured using metal, such as aluminum, iron, copper, or titanium, alloy thereof, or plastic that is harder than the cylindrical elastic member 360, for example. The contact member 370 may be manufactured by modifying the same material as the cylindrical elastic member 360 due to heating or so and hardening it.

The purge nozzle 300 can be connected to the purge ports 5-1 and 5-2 with an excellent airtightness due to elastic deformation of the cylindrical elastic member 360. Since the contact member 370 contacting with the purge ports 5-1 and 5-2 is harder than the cylindrical elastic member 360, the contact part can be effectively prevented from being damaged at the time of lowering of the purge nozzle due to adhesion of the contact part to the purge ports 5-1 and 5-2 even when being in contact with the purge ports 5-1 and 5-2 for a long time compared with a direct contact between the tip of the cylindrical elastic member 360 and the purge ports 5-1 and 5-2. In the purge nozzle 300, it is also possible to prevent abrasion of the contact part, generation of particles, and operation failure caused by dust.

NUMERICAL REFERENCES

1 . . . wafer
2 . . . sealed transport container (storage object)
2b . . . outlet
2d . . . first side surface
2e . . . second side surface
2f . . . bottom part
3 . . . positioning portion
5-1 . . . first purge port
5-2 . . . second purge port
7 . . . engagement end edge
10 . . . load port apparatus
11 . . . wall member
12 . . . installation stand
13 . . . delivery port
14 . . . movable table
20-1 . . . first gas purge unit
20-2 . . . second gas purge unit
26-1 . . . first nozzle driving mechanism
26-2 . . . second nozzle driving mechanism
30-1 . . . first purge nozzle
30-2 . . . second purge nozzle
300 . . . purge nozzle
32, 320 . . . nozzle body
32a, 320a . . . nozzle opening
36 . . . seal member
360 . . . cylindrical elastic member
370 . . . contact member
50 . . . clamp mechanism
52 . . . hook
52a . . . engagement convex part
80 . . . control means
90 . . . regulating position
91 . . . first elevated position
91a . . . first distance
92 . . . second elevated position
92a . . . second distance

The invention claimed is:

1. A gas purge apparatus for introducing a cleaning gas into a container whose bottom part includes a first purge port and a second purge port, comprising:
   a table on which the container is detachably installed;
   a movement regulating mechanism configured to contact with the container at a predetermined regulating position and regulate a relative movement at least in an upward direction of the container to the table;
   a first purge nozzle configured to airtightly connect to the first purge port at a first elevated position whose distance from the regulating position is a first distance;
   a second purge nozzle configured to airtightly connect to the second purge port at a second elevated position whose distance from the regulating position is a second distance that is longer than the first distance and whose distance from the first elevated position is longer than the second distance;

a first nozzle driving mechanism configured to move the first purge nozzle between a first lowered position spaced from the first purge port and the first elevated position;
a second nozzle driving mechanism configured to move the second purge nozzle between a second lowered position spaced from the second purge port and the second elevated position; and
a control means configured to control the first and second nozzle driving mechanisms,
wherein the control means is configured to control the nozzle driving mechanisms so that the first gas purge nozzle contacts with the first purge port before the second purge nozzle contacts with the second purge port.

2. The gas purge apparatus as set forth in claim 1, wherein an outlet capable of transporting a storage object housed in the container is formed on a first side surface that is one of a plurality of side surfaces of the container and
a distance from the regulating position to the first side surface is shorter than a distance from the regulating position to a second side surface that is another one of a plurality of the side surfaces of the container and opposes the first side surface in a state where the movement regulating mechanism regulates a movement of the container.

3. The gas purge apparatus as set forth in claim 2, wherein the first and second elevated positions and a storage object housed in the container whose movement is regulated by the movement regulating mechanism are arranged to avoid overlapping with each other in an orthographic view from above.

4. The gas purge apparatus as set forth in claim 3, wherein at least one of the first and second purge nozzles comprises:
a nozzle body configured to have a cylindrical shape whose upper end has an upper opening and be hardly deformable while moving from the first or second elevated position to the first or second lowered position;
a cylindrical elastic member configured to have a base end portion fixed to the nozzle body to surround the upper opening and be elastically deformable while moving from the first or second elevated position to the first or second lowered position; and
a contact member configured to be provided at a tip of the cylindrical elastic member and contact with the first or second purge port at the first or second elevated position, and
wherein the contact member is harder than the cylindrical elastic member.

5. The gas purge apparatus as set forth in claim 2, wherein at least one of the first and second purge nozzles comprises:
a nozzle body configured to have a cylindrical shape whose upper end has an upper opening and be hardly deformable while moving from the first or second elevated position to the first or second lowered position;
a cylindrical elastic member configured to have a base end portion fixed to the nozzle body to surround the upper opening and be elastically deformable while moving from the first or second elevated position to the first or second lowered position; and
a contact member configured to be provided at a tip of the cylindrical elastic member and contact with the first or second purge port at the first or second elevated position, and
wherein the contact member is harder than the cylindrical elastic member.

6. The gas purge apparatus as set forth in claim 1, wherein the first and second elevated positions and a storage object housed in the container whose movement is regulated by the movement regulating mechanism are arranged to avoid overlapping with each other in an orthographic view from above.

7. The gas purge apparatus as set forth in claim 6, wherein at least one of the first and second purge nozzles comprises:
a nozzle body configured to have a cylindrical shape whose upper end has an upper opening and be hardly deformable while moving from the first or second elevated position to the first or second lowered position;
a cylindrical elastic member configured to have a base end portion fixed to the nozzle body to surround the upper opening and be elastically deformable while moving from the first or second elevated position to the first or second lowered position; and
a contact member configured to be provided at a tip of the cylindrical elastic member and contact with the first or second purge port at the first or second elevated position, and
wherein the contact member is harder than the cylindrical elastic member.

8. The gas purge apparatus as set forth in claim 1, wherein at least one of the first and second purge nozzles comprises:
a nozzle body configured to have a cylindrical shape whose upper end has an upper opening and be hardly deformable while moving from the first or second elevated position to the first or second lowered position;
a cylindrical elastic member configured to have a base end portion fixed to the nozzle body to surround the upper opening and be elastically deformable while moving from the first or second elevated position to the first or second lowered position; and
a contact member configured to be provided at a tip of the cylindrical elastic member and contact with the first or second purge port at the first or second elevated position, and
wherein the contact member is harder than the cylindrical elastic member.

9. The gas purge apparatus as set forth in claim 1, wherein one of the first and second purge nozzles is for supply, and the other is for discharge.

10. A load port apparatus comprising the gas purge apparatus as set forth in claim 1.

11. A gas purge method for introducing a cleaning gas into a container whose bottom part includes a first purge port and a second purge port, comprising the steps of:
installing the container on a table;
regulating a relative movement at least in an upward direction of the container to the table by a movement regulating mechanism configured to contact with the container at a predetermined regulating position;
escalating a first purge nozzle from a first lowered position spaced from the first purge port to a first elevated position whose distance from the regulating position is a first distance, wherein the first purge nozzle is airtightly connected to the first purge port at the first elevated position; and escalating a second purge nozzle from a second lowered position spaced from the second purge port to a second elevated position whose distance from the regulating position is a second distance that is longer than the first distance and whose distance from the first elevated position is a second elevated position that is longer the second distance, wherein the second purge nozzle is airtightly connected to the second purge port at the second elevated position, wherein the first and second purge nozzles are configured to be escalated so that the first purge nozzle contacts with the first purge port before the second purge nozzle contacts with the second purge port.

* * * * *